(12) United States Patent
Kulwicki et al.

(10) Patent No.: US 6,331,325 B1
(45) Date of Patent: Dec. 18, 2001

(54) BARIUM STRONTIUM TITANATE (BST) THIN FILMS USING BORON

(75) Inventors: Bernard M. Kulwicki, North Attleboro, MA (US); Robert Tsu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/315,454

(22) Filed: Sep. 30, 1994

(51) Int. Cl.$^7$ ...................................................... B05D 5/12
(52) U.S. Cl. .......................... 427/79; 427/80; 427/126.3; 29/25.03; 29/25.41
(58) Field of Search ........................... 427/79, 80, 126.3, 427/226; 501/134, 135, 136, 137, 138, 139; 29/25.03, 25.41

(56) References Cited

U.S. PATENT DOCUMENTS

| | | | |
|---|---|---|---|
| 4,379,854 | * 4/1983 | Soong ................................. | 501/138 |
| 4,408,254 | * 10/1983 | Chu et al. ............................ | 501/136 |
| 4,447,549 | * 5/1984 | Masujima et al. ................... | 501/139 |
| 4,485,094 | * 11/1984 | Pebler et al. ........................ | 427/226 |
| 4,863,883 | * 9/1989 | Menashi et al. ..................... | 501/139 |
| 4,959,089 | * 9/1990 | Bhargaua et al. ................... | 65/33 |
| 4,963,390 | * 10/1990 | Lipeles et al. ...................... | 427/226 |
| 4,988,650 | * 1/1991 | Takagi et al. ....................... | 501/139 |
| 5,160,762 | * 11/1992 | Brand et al. ........................ | 427/226 |
| 5,292,694 | * 3/1994 | Abe et al. ........................... | 501/139 |
| 5,368,834 | * 11/1994 | Kulwicki et al. ................... | 501/137 |
| 5,378,667 | * 1/1995 | Kim et al. ........................... | 501/136 |

OTHER PUBLICATIONS

I. K. Yoo, S. B. Sesu, and J. Xing, Mat. Res. Soc. Symp. Proc. vol. 310 (1993).
L. A. Xue, Y. Chen, and R. J. Brook, Materials Science and Engineering, B1, 193–201, (1988).
Rainer Waser, J. A Am. Ceram. Soc. 74(8), 1934–40 (1991).
Lead Borate Class—A New Sintering Agent for BaTiD$_3$ Ceramics—C.H. Wang, L. W S., JPN. J. Appl. Phys, vol. 32 (1993 pp. 2020–2024.

* cited by examiner

*Primary Examiner*—Brian K. Talbot
(74) *Attorney, Agent, or Firm*—Wade James Brady, III; Frederick J. Telecky, Jr.

(57) ABSTRACT

A semiconductor device and process for making the same are disclosed which incorporate boron, which has been found to be substantially insoluble in BST, into a BST dielectric film 24. Dielectric film 24 is preferably disposed between electrodes 18 and 26 (which preferably have a Pt layer contacting the BST) to form a capacitive structure with a relatively high dielectric constant and relatively low leakage current. Boron included in a BST precursor may be used to form boron oxide in a second phase 30, which is distributed in boundary regions between BST crystals 28 in film 24. It is believed that the inclusion of boron allows for BST grains of a desired size to be formed at lower temperature, and also reduces the leakage current of the capacitive structure.

10 Claims, 1 Drawing Sheet

BARIUM STRONTIUM TITANATE (BST) THIN FILMS USING BORON

CROSS REFERENCE TO RELATED APPLICATIONS

The following related applications were filed concurrently with the instant application:

Docket # Serial # Filing Date Inventors Title

TI-19674—Tsu et al. Improvement of Barium Strontium Titanate (BST) Thin Films by Erbium Donor Doping TI-19675—Tsu et al. Improvement of Barium Strontium Titanate (BST) Thin Films by Holmium Donor Doping The following application is related to the instant application:

Ser. No. 08/283,441 Aug. 1, 1994 Summerfelt A Conductive Amorphous-Nitride Barrier Layer for High-Dielectric-Constant Material Electrodes

FIELD OF THE INVENTION

This invention relates to high dielectric constant thin films for microelectronic devices, and more particularly to improving dielectric properties of such films.

BACKGROUND OF THE INVENTION

Dynamic random-access memory (DRAM) integrated circuits, for example, are commonly used for storing data in a digital computer. Currently available DRAMs may contain over 16 million memory cells fabricated on a single crystal silicon chip, each memory cell generally comprising a single transistor connected to a tiny capacitor. In operation, each capacitor may be individually charged or discharged in order to "store" one bit on information. A DRAM is dynamic in the sense that charged memory cells must be refreshed, or recharged, periodically to maintain data integrity; otherwise, charged memory cells may quickly (generally in a fraction of a second) discharge through leakage to a point where they no longer appear to be set to the charged state.

To facilitate construction of 64 Mbit, 256 Mbit, 1 Gbit, and larger DRAMs with correspondingly smaller memory cells, capacitor structures and materials which can store the necessary charge in less chip space are needed; one of the most promising avenues of research is in the area of high dielectric constant materials (defined herein as having dielectric constants greater than 50). Lead zirconate titanate (PZT), barium titanate, strontium titanate, and barium strontium titanate are some common examples of such materials. It is desirable that such a material, if used for DRAMs and other microelectronics applications, be formable over an electrode and underlying structure (without significant harm to either), have low leakage current characteristics and long dielectric lifetime, and, for most applications, possess a high dielectric constant at frequencies of hundreds of MHz up to several GHz.

SUMMARY OF THE INVENTION

The present invention relates to a method of producing and a structure containing barium and/or strontium titanate dielectric films (hereafter referred to as BST) with improved properties. It is now believed that such a film may be fabricated using boron as an additive to effect such improvements. For example, boric acid may be added to a liquid precursor for metal-organic decomposition (MOD) to form a BST film. It has been discovered that the boric acid apparently does not negatively affect the deposition properties of such MOD BST, and that the boron remains virtually insoluble in the BST grains as they form. Generally, in the final film structure, boric oxide ($B_2O_3$) exists in a second phase, or boundary region, between the BST grains (which form the first phase).

It is believed that boric oxide residing in such a second phase impedes charge leakage (i.e. leakage current) along the BST grain boundaries when a voltage is applied across the dielectric film. This may not be the only explanation for lowered leakage current: compensation of vacancies or space charge by dopants may decrease tunneling leakage while retaining a high Schottky barrier height. Also, there is some evidence that Schottky emission may dominate leakage in the high voltage regime, e.g. above 2 V, while relaxation polarization contributes to leakage at lower voltages.

Apparently, boric oxide formation, in the precursor or during annealing, may also be beneficial in reducing temperature requirements and stress during annealing (during which time a boric oxide second phase would most likely by mobile, given that the melting point of $B_2O_3$ is 450 C) of a BST film. Also, the use of boron in a semiconductor fabrication process is well understood, and boron addition appears readily adaptable to many forms of BST deposition such as: MOD using spin-on precursors, MOD using vapor phase transportation, and sol-gel techniques.

Consequently, the present invention includes a novel method of forming a barium and/or strontium titanate dielectric film on a microelectronic device. In this method, a precursor is prepared by combining compounds of the elements boron, titanium, and at least one of barium and/or strontium, preferably with the molar ratio of boron to titanium in the precursor being between 0.001 and 0.1. One or more layers of such a precursor may be deposited and densified to form a precursor film on the device. The precursor film may subsequently be annealed at a predetermined temperature (generally above 450 C, and preferably between 600 C and 800 C) in an oxygen-containing atmosphere. This annealing forms, substantially uniformly distributed, a two-phase dielectric film: the first phase contains a plurality of BST grains; the second phase principally comprises boron oxide or boron oxide and titanium oxide (the second phase is believed to be generally amorphous).

The precursor may, for example, be prepared by combining barium acetate, strontium acetate, titanium ammonium lactate, and boric acid in a common aqueous solution. Other organic solvents may be added to the precursor to, for example, adjust the viscosity. The BST grains produced may be selected over a wide range of barium-strontium combinations (with between 40% and 70% of barium-strontium lattice sites in the grains occupied by barium being preferred). The dielectric film may be purposely constructed to be titanium rich; i.e., only 93% to 99.9% of the titanium in the precursor may be required to produce stoichiometric BST; it is believed that the remainder exists in the boundary regions as oxidized titanium.

The present invention also comprises a method of forming a capacitive structure on a microelectronic device; such a capacitive structure generally having a dielectric laminate disposed between a first electrode and a second electrode. The method may comprise forming a first electrode on a substrate. The method further comprises depositing two or more films over the first electrode, with each film comprising titanium and at least one of barium and strontium. Additionally, at least one of the films further comprises boron, preferably in a ratio to titanium of at least 0.001. The method further comprises annealing the films at a temperature above the melting point of $B_2O_3$ in an oxygen-containing atmosphere. This is believed to form a dielectric laminate comprising a plurality of grains with a perovskite crystal structure, each grain comprising titanium, oxygen, and at least one of barium and strontium; furthermore, essentially all of the boron exists in boundary regions between the grains as $B_2O_3$. The method may further comprise forming a second electrode over the dielectric laminate.

In accordance with the present invention, a capacitive structure on a microelectronic device may be formed. In this structure, a dielectric laminate is dispersed between first and second electrodes. Generally, this dielectric laminate comprises two or more grains (and typically a large number of grains) having a perovskite crystal structure, each grain comprising titanium, oxygen, and at least one of barium and strontium. This laminate may further comprise $B_2O_3$ in boundary regions between the grains in at least a sublayer of the laminate. Preferably, such a sublayer has a ratio of boron to titanium of between 0.001 and 0.1.

The grains may further comprise dopant material (acceptor, donor, or two dopants, an acceptor and a donor) replacing at least 200 ppm of the barium, strontium, or titanium in the perovskite crystal structure. Preferably, the grains in the laminate have a median size of between 10 nm and 50 nm. Also, the structure may be made titanium-rich as previously detailed.

BRIEF DESCRIPTION OF THE DRAWINGS

This invention, including various features and advantages thereof, can be best understood by reference to the following drawings, wherein.

DETAILED DESCRIPTION OF THE PREFERRED EMBODIMENTS

High dielectric constant (HDC) materials have many microelectronic applications, such as DRAMs, static RAMs, and infrared detectors. Typically, these applications employ HDC materials in a capacitive structure, although the present invention may be used to make an HDC thin film with improved properties which is not part of a capacitor. For purposes of discussion, a capacitive structure containing an HDC thin film is shown in FIG. 1.

Figure 1A:
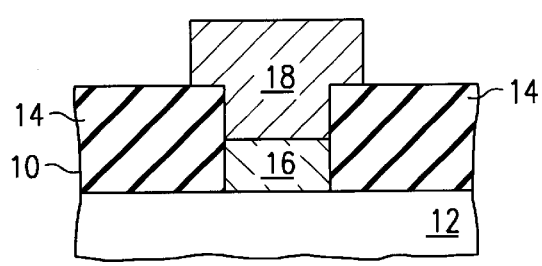
FIGS. 1A, 1B, 1C, and 1D show cross-sectioned elevations of one embodiment of a capacitive structure made according to a method of the invention.

A microelectronic device 10 is shown partially constructed in FIG. 1A. This device comprises a semiconductor substrate 12 (e.g. silicon), with an overlying insulation layer 14 (preferably of silicon dioxide). A first electrode 18 (preferably of platinum) is electrically connected to the substrate through a diffusion barrier 16 (e.g. of titanium nitride), this construction being used to prevent silicon in substrate 12 from diffusing through electrode 18 and forming silicon dioxide at the electrode-BST interface.

A BST precursor solution for thin films may be prepared as an aqueous solution of appropriate individual precursors, such as barium acetate, strontium acetate, and titanium ammonium lactate. Each individual precursor is preferably filtered (e.g. to a 0.2 $\mu$m level) to remove particulates which may impair the integrity of the films. The individual precursors are then blended and the stoichiometry (i.e. mole ratio) of the precursor solution is adjusted to that needed for a desired BST film (for example $Ba_{0.67}Sr_{0.33}TiO_3$). At this point, the solution typically contain 10% to 15% oxide by weight.

The paper "Lead Borate Glass—A New Sintering Agent for $BaTiO_3$ Ceramics", C. H. Wang et al., *Japan Journal of Applied Physics*, Vol. 32 (1993), pp. 2020–2024, discloses an additive for bulk barium titanate. The lead borate glass additive is shown to have a significant effect on densification, grain size, and grain size distribution for bulk barium titanate. Unfortunately, such a technique has disadvantages for thin film semiconductor dielectric applications: sintering temperatures are high (greater than 1150 C); bulk material vs. thin film formation method; lead may be problematic in a semiconductor application.

It has been found that a BST precursor solution for thin films may, however, be modified to add boron. For example, boric acid may be added to the precursor solution described above such that the mole ratio of boron to titanium in the solution is roughly 0.04. Alternately, powdered boric oxide ($B_2O_3$) may be dissolved in the precursor solution directly.

For application by a spin-on technique, the precursor solution may be evaporated down to remove most of the water. The residue may be mixed with further solvents (typically in a 1:1 to 1:2 ratio of residue to solvent), such as ethylene glycol monomethyl ether (EGME), isobutyl alcohol, or methoxymethanol to adjust viscosity and deposition thickness. The precursor solution may then be filtered through a 0.2 $\mu$m syringe and spin-coated (typically at 2000 to 3500 rpm, depending on desired film thickness) onto a wafer containing, e.g., device 10.

Figure 1B:
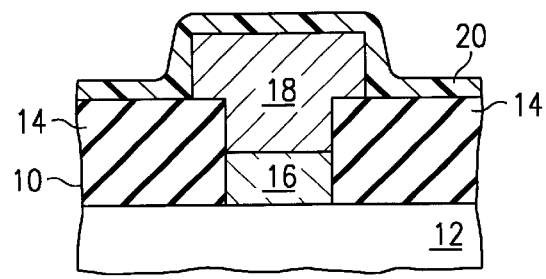

A first precursor film 20 is shown in FIG. 1B after spin-coating onto device 10. This film may, for example, be limited to 10–50 nm in thickness; at large thicknesses, the subsequent MOD reactions are difficult to complete. Typically, after spin-coating, a densification step (e.g. at 80 C to 200 C in a nitrogen ambient) is used to desorb solvents from and help prevent formation of voids in film 20. This may be followed by a firing (e.g. in an oxygen ambient such as $O_2$, $N_2O$, or $O_3$, at 400 C to 500 C, preferably 450 C) to decompose metal-organics and further densify film 20.

Figure 1C:
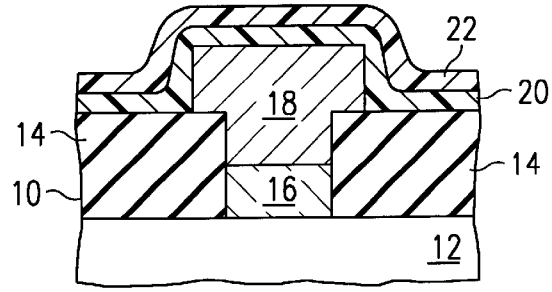

A second precursor film 22 (of the same precursor in this example) is shown in FIG. 1C after spin-coating and densification by the method described above. Several more precursor films may be added to obtain a desired thickness before final anneal. Final anneal temperatures generally range from 600 C to 800 C (700 C being preferable), and the anneal is carried out in an oxygen ambient such as $O_2$, $N_2O$, or $O_3$. During this anneal, perovskite phase BST crystals nucleate in the amorphous BST film and grow to a typical size of 10 nm to 50 nm. It is believed that $B_2O_3$ remains amorphous as a mobile second phase during the anneal ($B_2O_3$ "melts" at 450 C, and B is virtually insoluble in crystalline BST), and flows along the grain boundaries as the grains grow. This may be advantageous in reducing stress during anneal and subsequent cooling, reducing deformation of BST crystal structure along grain boundaries, and allowing some reorientation and shifting of grains during anneal.

Figure 1D:
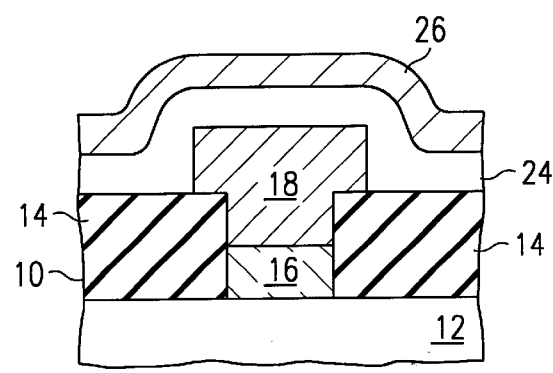

Dielectric film 24, shown in FIG. 1D, is a crystallized BST film with amorphous $B_2O_3$ in a second phase. This film is formed from precursor films 20 and 22, which are believed to join seamlessly (some BST crystals are formed which contain material from both films) during annealing. To complete a capacitor structure for device 10, a second (i.e. top) electrode 26 (preferably of platinum) may be deposited over dielectric film 24. It may be desirable to post-anneal device 10 after deposition of electrode 26 (e.g. at 550 C in $O_2$ for 1 hour) to desorb any water which may have been absorbed into the BST-second electrode interface. Note that this post-anneal may also temporarily soften a $B_2O_3$ second phase in film 24.

Figure 2:
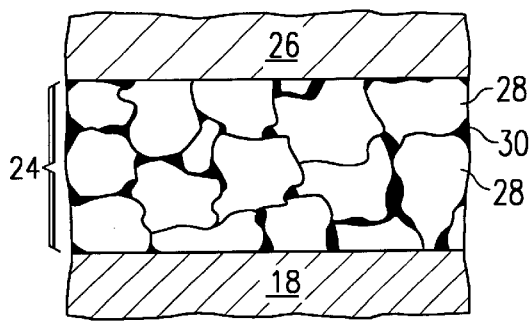
FIG. 2 shows a cross-sectioned segment of a capacitive structure such as that of FIG. 1, illustrating a two-phase dielectric laminate.

FIG. 2 contains an illustration of a portion of FIG. 1D, magnified to show detail in dielectric film 24. In this film, roughly 3 sublayers of grains 28 (e.g. of BST) are illustrated, although more or less may exist in a film, and grains may be grown which are more columnar than shown. Grains 28 form a discontinuous first phase in film 24, with non-crystalline interfaces along grain boundaries. When an insoluble material such as $B_2O_3$ is included in film 24, it is believed to mold into a second phase 30 in "boundary regions" between growing grains. As grains grow to consume available amorphous BST, second phase 30 may be forced into pockets, or more completely coat individual grains, depending on grain size, shape, and the relative amount of boron included.

Apparently, at least a portion of leakage observed in polycrystalline HDC materials depends on grain boundary composition. Although not well understood, boric oxide apparently passivates the discontinuities between grains and reduces observed dielectric leakage. Unfortunately, a boric oxide second phase may also decrease the dielectric constant of a layer. At some point, adding more boron becomes unattractive; dielectric constant begins to decrease more rapidly than leakage current. Boron to titanium ratios of 0.001 to 0.1 may be beneficial, depending on grain size, with ratios of 0.01 to 0.05 preferred for grains sizes in the tens of nm range.

Figure 3:
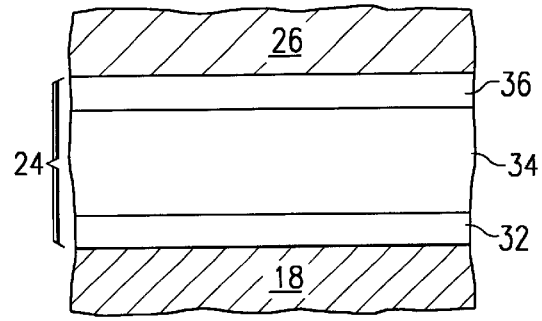
FIG. 3 shows a cross-sectioned segment of an embodiment wherein a dielectric laminate is constructed of 3 BST layers of varying composition.

An improved dielectric structure may be formed as shown in FIG. 3. This structure shows a dielectric film 24 comprising three separate (but not necessarily distinct) sublayers 32, 34, and 36. Using a layered MOD deposition technique such as described herein, such a structure may be formed using precursors with different constituent ratios. For example, sublayer 34 may be deposited with a stoichiometry which forms $Ba_{0.67}Sr_{0.33}TiO_3$ grains when annealed, with little or no second phase boron. Such a sublayer has a Curie point near room temperature, thus maximizing dielectric constant (but with a large dielectric leakage value). However, sublayers 32 and 36 may, for example, be deposited with a stoichiometry which forms barium strontium titanate (possibly having a different Ba—Sr ratio than layer 34) with 4% boric oxide in a second phase upon annealing, with somewhat lower dielectric constant but markedly improved leakage characteristics.

Such a capacitive structure may, for example, use a relatively thick sublayer 34 if leakage is controllable using thin sublayers 32 and 36. During anneal, some cross-mixing of layers may occur, such that for the specific example, graded transition regions between adjacent sublayers 32, 34, and 36 may exist, with a graded boron second phase. The laminated structure may subsequently be treated as a single dielectric film with improved dielectric properties.

The invention is not to be construed as limited to the particular examples described herein, as these are to be regarded as illustrative, rather than restrictive. Although specific materials and processing techniques are described in the detailed description, many alternates exist. For example, electrodes may be constructed of Pt, Pd, Rh, Au, Ir, $RuO_2$, TaSiN, TiSiN, or alloys of these. Barrier layer 16 may alternately be constructed, e.g., of ZrN, HfN, TaSiN, or TiSiN. The shape of the capacitive structure discussed herein is meant to be illustrative, as the present invention may be applicable to a wide variety of HDC capacitor structures. The dielectric sublayers may be reversed such that a boron-containing sublayer is sandwiched between two non-boron-containing sublayers. Similarly, one sublayer of each type can be used, or more than three total sublayers can be used. Likewise, the ordering of electrode and dielectric formation may differ from that described (e.g. both electrodes may be formed after formation of a BST layer), in which case other electrode materials (e.g. low melting point) not mentioned above may be used. Titanium-rich precursors, which may also form oxidized titanium in boundary regions, as well as BST-soluble donor or acceptor dopants, are comprehended within the present invention. The BST with dopant film deposition method is not limited by MOD while it includes CVD such as MOCVD, plasma enhanced CVD, and physical vapor deposition such as sputtering.

What is claimed is:

1. A method of forming a barium and/or strontium titanate dielectric film on a microelectronic device, said method comprising:

(a) preparing a precursor solution by combining a boron compound, a titanium compound, and a precursor selected from the group consisting of barium compounds, strontium compounds, and combinations thereof, such that the molar ratio of boron to titanium in said precursor solution is between 0.001 and 0.1;

(b) depositing and densifying one or more layers of said precursor solution to form a precursor film on said device; and (c) annealing said precursor film in an oxygen-containing atmosphere, thereby forming said dielectric film comprising substantially uniformly distributed first and second phases, said first phase containing a plurality of barium and/or strontium titanate grains and said second phase principally comprising boron oxide, whereby said boron in said precursor apparently lowers the processing temperature required to produce said titanate grains, and whereby boron additionally decreases the dielectric leakage current observed for said dielectric film.

2. The method of claim 1, wherein between 93% and 99.9% of said titanium is incorporated in said grains, with the remainder of said titanium comprising oxidized titanium and existing in said second phase.

3. The method of claim 1, wherein the molar ratio of barium to titanium in said first phase is between 0.40 and 0.70.

4. The method of claim 1, wherein formation of said boron oxide is completed during said step of densifying said precursor film.

5. The method of claim 4, wherein said annealing step is performed at a temperature above 450° C.

6. The method of claim 1, wherein said step of preparing a precursor solution comprises combining titanium ammonium lactate, boric acid, and at least one of barium acetate and strontium acetate, in a common aqueous solution.

7. The method of claim 6, wherein said aqueous solution further comprises organic solvents.

8. A method of forming a capacitive structure on a microelectronic device, said capacitive structure having a dielectric laminate disposed between a first electrode and a second electrode, said method comprising:

(a) forming said first electrode on a substrate;

(b) depositing two or more precursor films over said first electrode, each of said films comprising titanium and at least one of barium and strontium, at least one of said films further comprising boron in a ratio to said titanium of at least 0.001;

(c) annealing said films at a temperature above 450 C in an oxygen-containing atmosphere, thereby forming said dielectric laminate comprising a plurality of grains with a perovskite crystal structure, each grain comprising titanium, oxygen, and at least one of barium and strontium, said dielectric laminate further comprising boundary regions between said grains, essentially all of said boron existing in said boundary regions as $B_2O_3$; and (d) forming a second electrode over said dielectric laminate.

9. The method of claim 8, wherein between 93% and 99.9% of said titanium is incorporated in said grains, with the remainder of said titanium comprising oxidized titanium and existing in said boundary regions.

10. The method of claim 8, wherein said grains further comprise dopant material replacing at least 200 ppm of at least one of said barium, said strontium, and said titanium in said perovskite crystal structure.

* * * * *